United States Patent
Ezell

[19]

[11] Patent Number: 6,104,242
[45] Date of Patent: Aug. 15, 2000

[54] HIGHLY LINEAR TRANSCONDUCTOR WITH PASSIVE FEEDBACK

[75] Inventor: Richard William Ezell, Carrollton, Tex.

[73] Assignee: Microtune, Inc., Plano, Tex.

[21] Appl. No.: 09/183,352

[22] Filed: Oct. 30, 1998

[51] Int. Cl.[7] .................................................. H03F 3/45
[52] U.S. Cl. ............................................. 330/252; 330/149
[58] Field of Search ................................. 330/149, 252, 330/260, 261

[56] References Cited

U.S. PATENT DOCUMENTS

| | | | |
|---|---|---|---|
| 4,498,054 | 2/1985 | Fukuda et al. | 330/261 |
| 5,148,119 | 9/1992 | Wright et al. | 330/259 |
| 5,602,509 | 2/1997 | Kimura | 330/253 |
| 5,621,356 | 4/1997 | Philippe | 330/252 |
| 5,742,248 | 4/1998 | Vorenkamp et al. | 341/156 |
| 5,872,483 | 2/1999 | Kimura | 327/563 |
| 5,963,975 | 10/1999 | Boyle et al. | 711/147 |

*Primary Examiner*—Robert Pascal
*Assistant Examiner*—Henry Choe
*Attorney, Agent, or Firm*—Fulbright & Jaworski L.L.P.

[57] ABSTRACT

A high linearity transconductance stage is arranged with a loss cancellation method to remove the nonlinearity of a typical transconductance circuit. The loss cancellation method uses a series of transistors and resistors to supply a controlled feedback current to cancel the result of the change ($\Delta$) in voltage across the input of the transistor used to provide the transconductance for the transconductance stage of a circuit, such as an amplifier, a mixer or other active circuit.

17 Claims, 1 Drawing Sheet

HIGHLY LINEAR TRANSCONDUCTOR WITH PASSIVE FEEDBACK

BACKGROUND OF THE INVENTION

U.S. Pat. No. 5,737,035, dated Apr. 7, 1998, shows a tuner circuit in which the Video Detector (VDET) requires a highly linear mixer to convert the second IF to baseband frequencies. The input to the mixer comes from a Variable Gain Amplifier, which buffers signals from the Second IF Filter. Its output supplies a buffer to drive a Video Sound Trap. Its Third-Order Input Intercept Point (IIP3) requirement, which is an indicator of linearity, should be high, ideally on the order of 80 dBmV or more. Moreover, signal amplitude in this path will be high to maximize the Signal-to-Noise Ratio (on the order of 60 dBmV). This precludes the use of any circuitry which would limit headroom for the signal.

The mixer itself consists of a transconductance (gm) stage and a mixing stage formed by a bipolar transistor pair. The gm stage is where most distortion occurs, and many methods have been proposed to overcome this problem, not only for mixers, but also for amplifiers.

The nonlinearity of the transconductance of each transistor comes from the fact that the gain is not constant over a range of input voltages. This nonlinearity is manifested in a change (Δ) in voltage across the input of the transistor to its output. For a bipolar transistor, this is from the base to the emitter. For a MOS transistor, this is from the gate to the source.

A common linearization scheme used in this instance is the "multi-tanh" method. An example of this method can be found in "The Multi-Tanh Principle—A Tutorial Overview," IEEE J. Solid-State Circuits, Vol. 33, pp. 2–17, January, 1998. This scheme uses transistors biased at different levels to form a piecewise-linear amplifier. In effect it is several amplifiers in parallel which operate at select input offsets. Each amplifier's transfer curve overlaps its neighbor's to form a smooth response. Unfortunately, this can supply only a limited signal handling capability for a given amount of power, and requires multiple bias voltages.

Accordingly, a need exists in the art for a highly linear mixer capable of handling a wide range of signal amplitudes with a minimum of complexity.

A further need exists for such a circuit which can be constructed on a single substrate and which is not affected by, nor produces, substrate noise injection.

SUMMARY OF THE INVENTION

These and other objects, features and technical advantages are achieved by a system and method which applies passive feedback to increase linearity, without sacrificing headroom or overly increasing its complexity. The device is a fully differential structure to reduce the effects of on-chip substrate injection and supply line fluctuations. Further, one circuit does not require complex biasing to maintain its performance. The circuit overcomes distortion due to the varying transconductance of the input transistors by using a passive current cancellation technique.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DESCRIPTION OF THE INVENTION

Figure 2:
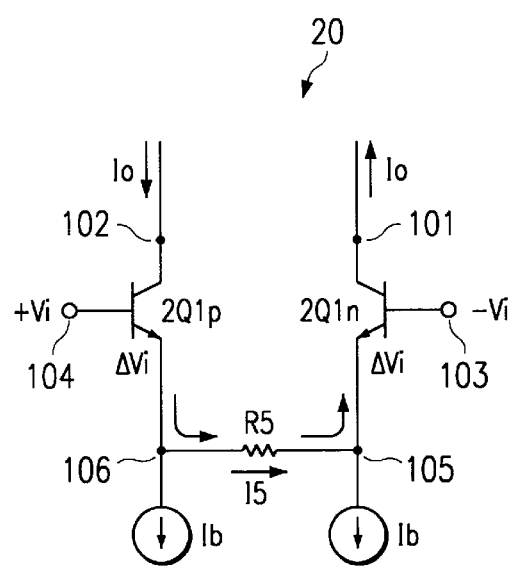
FIG. 2 illustrates a typical prior art resistively loaded NPN transconductance pair without linearization circuitry.

Turning now to FIG. 2, we can review the prior art with respect to circuit 20. Transistors 2Q1P and 2Q1N are biased by current sources Ib and do not contribute to the AC current flow. The output current is plus or minus Io. To accomplish the transconductance, a differential voltage Vi is applied at the input to the transistors which causes a current to flow through R5. For this circuit, an approximation for current Io is given below in Equation 1.

$$Io \cong \frac{2(Vi - \Delta Vi)}{R5} \bigg| \qquad \text{(Eq.1)}$$

It is the approximation that is the problem. As the transconductance of these transistors changes over the signal range, distortion is caused and that is what must be canceled with the current feedback technique that will be discussed herein. As +Vi goes up, an increase in current flows through R5, but this is not a one-for-one relationship. There is a loss in transistor 2Q1P that I am calling ΔVi being across the base to emitter. It is seen as an increase in voltage between the base and the emitter of transistor 2Q1P which becomes a voltage drop across R5. Thus, the loss due to the limited transconductance of transistor 2Q1P equals $$\frac{\Delta Vi}{R5}.$$

A corollary is shown with respect to transistor 2Q1N such that as −Vi goes down, the base to emitter voltage decreases by ΔVi, thereby giving the other side $$\frac{\Delta Vi}{R5}$$

through R5 so both transistors are contributing to essentially a loss of gain through the device, totaling $$\frac{2\Delta Vi}{R5}.$$

If this ΔVi were a constant loss, it would not be distortive. Distortion arises when the transconductance changes over the cycle of the wave or over the steady state point so that at one point of the sine wave there is going to be one transconductance and at another point of the sine wave there is going to be a different transconductance.

Figure 1:
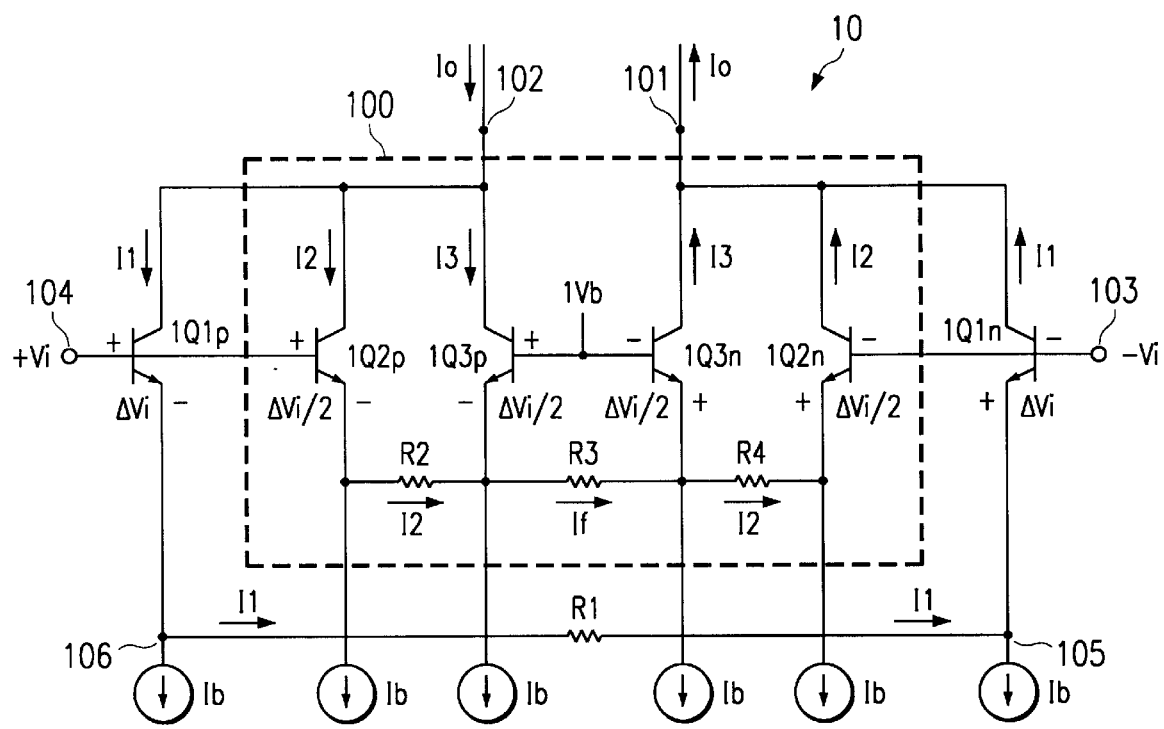
FIG. 1 illustrates a resistively loaded NPN transconductance pair employing linearization circuitry to minimize distortion.

The above-described non-linear problems are solved by a circuit, such as shown in the preferred embodiment 10 in FIG. 1, which employs a variation of a resistively-loaded NPN transconductance pair, 1Q1p and 1Q1n. The linearization scheme is comprised of circuitry within circuit 10.

Continuing in FIG. 1, the AC output current I1 for a given AC input voltage Vi is given by Equation 2. Base current is neglected, and ΔVi refers to the base-emitter voltage change of transistors 1Q1P & 1Q1N for a given Vi. This voltage change is due to the transistor's limited transconductance.

$$I1 \cong \frac{2(Vi - \Delta Vi)}{R1} \quad (Eq.2)$$

ΔVi may be thought of as a simplified loss term which decreases as the transconductance, or gm, of the transistor is increased. Because gm is not constant, this "loss" is not constant, but varies as the operating point of the amplifier changes, giving rise to distortion. This effect is exacerbated by large input levels, which change gm by a greater amount.

Circuit 10 overcomes distortion due to the varying transconductance of the input transistors by using a passive current cancellation technique. Transistors 1Q2p, 1Q2n, 1Q3p, 1Q3n, in conjunction with resistors R2, R3, R4 are part of a network that adds a feedback current to the output current Io. This feedback is approximately equal to the current loss of 2·ΔVi/R1 given in Equation 2. Bias voltage Vb is set to the DC bias point of Vi.

For a given Vi, AC currents, as shown in FIG. 1, are given by Equations 3 through 7 where R equals the value of resistor R1. The values of R2, R4 and R5 are equal to R, the value of resistor R3 is equal to R/2. The feedback current is produced from the summation of I2 and I3, yielding If. Thus, the output current Io simplifies to a relationship which does not depend on ΔVi, canceling a major source of distortion.

$$I2 \cong \frac{Vi - \Delta Vi}{R} \quad (Eq.\ 3)$$

$$If \cong \frac{2\Delta Vi}{R} \quad (Eq.\ 4)$$

$$I3 = If - I2 \quad (Eq.\ 5)$$

$$Io = I1 + I2 + I3 = I1 + If \quad (Eq.\ 6)$$

$$Io \cong \frac{2Vi}{R} \quad (Eq.\ 7 \text{ from Eqs. 2 and 4})$$

This analysis is based upon first-order approximations of a single simplified loss term ΔVi and yields a result that is close to actual device operation. Thus, this circuit and method removes the ΔVi loss term which is associated with distortion in the actual circuit.

This circuit is thus usable with an amplifier or a mixer or any other circuit that uses a transconductance stage to achieve increased linearity and thus lower distortion of signals over a wide bandwidth. This circuit and method can thus be used as a building block in any transconductance circuit application where high linearity is required.

Although the present invention and its advantages have been described in detail, it should be understood that various changes, substitutions and alterations can be made herein without departing from the spirit and scope of the invention as defined by the appended claims.

What is claimed is:

1. A circuit for use in a transconductance stage of an active device, said circuit comprising:

means for generating an error correction current equal in magnitude but opposite in sign to error currents produced due to nonlinearities in the transconductance device of said transconductance stage, wherein said means for generating includes at least one transistor pair connected to an impedance and wherein one transistor of said pair has its input connected to the input of the transconductance stage and wherein the other transistor of said pair has its input connected to a bias voltage derived from the DC operating point of the input to the transconductance stage; and means for summing said generated error correction current into the signal path of said transconductance device to control said nonlinearity error currents.

2. The circuit of claim 1 wherein said bias voltage is equal to said DC operating point.

3. The circuit of claim 1 constructed on a single substrate.

4. A method for eliminating transconductance nonlinearities in a circuit, said method comprising the steps of:

generating an error correction current equal in magnitude but opposite in sign to error currents produced due to said nonlinearities in the transconductance circuit, wherein at least one transistor pair is connected to an impedance and wherein one transistor of said pair has its input connected to the input of the transconductance circuit and wherein the other transistor of said pair has its input connected to a bias voltage derived from the DC operating point of the input to the transconductance circuit; and summing said generated error correction current into the signal path of said transconductance circuit to control said nonlinearity currents.

5. The method of claim 4 wherein said bias voltage is equal to said DC operating point.

6. A transconductance circuit for use in a transconductance stage of an active device, said transconductance circuit comprising:

a differential pair of transconductance transistors for generating a transconductance current;

a first pair of transistors, wherein an input of a first transistor of said first pair of transistors is connected to the input of a first one of said transconductance transistors;

a second pair of transistors, wherein an input of a first transistor of said second pair of transistors is connected to the input of the second one of said transconductance transistors;

said first and second pairs of transistors for generating an error correction current, wherein said error correction current is equal in magnitude but opposite in sign to error currents produced due to nonlinearities in said transconductance transistors;

wherein the inputs of the second transistors of said first and second pair of transistors are each connected to a bias voltage derived from the DC operating point of the input to the transconductance stage; and wherein said transconductance current and error correction current are summed together to produce a transconductance stage output current.

7. The circuit of claim 6 where said bias voltage is equal to said DC operating point.

8. The transconductance circuit of claim 6 constructed substantially on a single substrate.

9. The transconductance circuit of claim 6, wherein said error correction current is the sum of a first current generated by said first transistors of said first and second pairs of transistors and a second current generated by said second transistors of said first and second pairs of transistors.

10. The transconductance circuit of claim 6 further comprising a coupling impedance connected to a coupling terminal of said transconductance transistors.

11. The transconductance circuit of claim 10 further comprising:
   a first impedance connected to a coupling terminal of said first pair of transistors;
   a second impedance connected to a coupling terminal of said second pair of transistors; and
   a third impedance connected between said coupling terminals of said first pair of transistors and said coupling terminals of said second pair of transistors.

12. The transconductance circuit of claim 11 constructed substantially on a single integrated circuit substrate.

13. A method for eliminating transconductance nonlinearities in a transconductance circuit wherein said transconductance circuit is a differential pair of transconductance transistors, said method comprising the steps of:
   connecting an input of a first transistor of a first pair of transistors to an input of a first one of said transconductance transistors;
   connecting an input of a first transistor of a second pair of transistors to an input of a second one of said transconductance transistors;
   connecting inputs of the second transistors of said first and second pair of transistors to a bias voltage derived from the DC operating point of the input to a transconductance stage;
   generating an error correction current equal in magnitude but opposite in sign to error currents produced due to said nonlinearities in the transconductance circuit; and
   summing said generated error correction current into the signal path of said transconductance circuit to control said nonlinearity currents.

14. The method of claim 13 performed substantially on a single substrate.

15. The method of claim 13, wherein said generating an error correction current step comprises the steps of:
   generating a first current, wherein said first current is generated by said first transistors of said first and second pairs of transistors;
   generating a second current, wherein said second current is generated by said second transistors of said first and second pairs of transistors; and
   summing said first and second currents to produce said error correction current.

16. The method of claim 13, wherein said summing step comprises the steps of summing said error correction current with a current generated by said pair of transconductance transistors.

17. The method of claim 16 performed substantially on a single substrate.

* * * * *